(12) United States Patent
Rozenzon et al.

(10) Patent No.: US 6,916,399 B1
(45) Date of Patent: Jul. 12, 2005

(54) TEMPERATURE CONTROLLED WINDOW WITH A FLUID SUPPLY SYSTEM

(76) Inventors: Yan Rozenzon, 3383 Lubich Dr., Mountain View, CA (US) 94040; Gil Lavi, 408 Offenback Pl., Sunnyvale, CA (US) 94087; Evans Y. Lee, 2327 Farmcrest St., Milpitas, CA (US) 95035; Dong Ho Choi, 749 Garland Dr., Palo Alto, CA (US) 94303; Matt Hamrah, 555 W. Middlefield Rd. #K 304, Mountain View, CA (US) 94043; Paul E. Luscher, 1365 Flicker Way, Sunnyvale, CA (US) 94087; Kaushik Vaidya, 1074 Reed Ave. Apt. 62, Sunnyvale, CA (US) 94086; Bryan Pu, 3064 Rosata Ct., San Jose, CA (US) 95135; Richard Fovell, 1691 Almond Blossom Land, San Jose, CA (US) 95124

( * ) Notice: Subject to any disclaimer, the term of this patent is extended or adjusted under 35 U.S.C. 154(b) by 0 days.

(21) Appl. No.: 09/325,026

(22) Filed: Jun. 3, 1999

(51) Int. Cl.$^7$ .............................. C23C 16/00; C23F 1/00
(52) U.S. Cl. ............................. 156/345.37; 118/723 R; 118/715; 118/722; 204/298.09
(58) Field of Search ...................... 156/345.47, 345.48, 156/345.27, 345.33, 345.34, 345.37, 345.43, 345.46; 204/298.09; 54/345; 118/723 R, 715, 722, 724, 723 I, 723 JR, 723 AN, 7.735, 773 E (56) References Cited

U.S. PATENT DOCUMENTS

| | | | |
|---|---|---|---|
| 4,262,631 A | * | 4/1981 | Kubacki ..................... 118/723 |
| 4,891,087 A | * | 1/1990 | Davis et al. ................. 156/345 |
| 4,917,044 A | * | 4/1990 | Yau et al. .................... 118/723 |
| 4,948,458 A | | 8/1990 | Ogle .......................... 156/643 |
| 5,000,113 A | * | 3/1991 | Wang et al. ............. 118/723 E |
| 5,074,456 A | | 12/1991 | Degner et al. .............. 228/121 |
| 5,200,232 A | | 4/1993 | Tappan et al. .............. 427/569 |
| 5,344,492 A | | 9/1994 | Sato et al. .................. 118/725 |
| 5,401,350 A | | 3/1995 | Patrick et al. .............. 156/345 |
| 5,435,881 A | | 7/1995 | Ogle .......................... 156/345 |
| 5,445,709 A | | 8/1995 | Kojima et al. ................. 216/71 |
| 5,465,680 A | | 11/1995 | Loboda ....................... 117/84 |
| 5,472,508 A | * | 12/1995 | Saxena .................... 118/723 E |
| 5,522,934 A | | 6/1996 | Suzuki et al. ......... 118/723 AN |
| 5,571,366 A | | 11/1996 | Ishii et al. .................. 156/345 |
| 5,578,164 A | | 11/1996 | Kurono et al. ........... 156/643.1 |
| 5,584,971 A | | 12/1996 | Komino ................. 204/192.13 |

(Continued)

FOREIGN PATENT DOCUMENTS

| | | |
|---|---|---|
| JP | 07-326587 | 12/1995 |
| JP | 08-187212 | 7/1996 |

*Primary Examiner*—Luzalejandro Mulero
(74) *Attorney, Agent, or Firm*—Moser, Patterson & Sheridan, L.L.P.; Joseph Bach (57) ABSTRACT

The present invention provides a temperature controlled energy transparent window or electrode used to advantage in a substrate processing system. The invention also provides methods associated with controlling lid temperature during processing and for controlling etching processes. In a preferred embodiment the invention provides a fluid supply system for the lid which allows the fluid to flow through a feedthrough and into and out of a channel formed in the window or electrode. The fluid supply system may also mount the window or electrode to a retaining ring which secures the window or electrode to the chamber. In another aspect the invention provides a bonded window or electrode having a first and second plate having a channel formed in the plates so that when the plates are bonded together they form a channel therein through which a temperature controlling fluid can be flowed. An external control system preferably regulates the temperature of the fluid.

20 Claims, 9 Drawing Sheets

U.S. PATENT DOCUMENTS

| | | |
|---|---|---|
| 5,595,606 A | 1/1997 | Fujikawa et al. ............ 118/725 |
| 5,653,806 A | 8/1997 | Van Buskirk ............... 118/715 |
| 5,665,166 A | 9/1997 | Deguchi et al. .......... 118/723 E |
| 5,711,987 A | 1/1998 | Bearinger et al. .............. 427/7 |
| 5,730,792 A | 3/1998 | Camilletti et al. ..... 106/287.14 |
| 5,766,364 A | 6/1998 | Ishida et al. ................ 118/725 |
| 5,776,235 A | 7/1998 | Camilletti et al. ....... 106/287.1 |
| 5,780,163 A | 7/1998 | Camilletti et al. .......... 428/446 |
| 5,781,693 A | 7/1998 | Ballance et al. ............ 392/416 |
| 5,818,071 A | 10/1998 | Loboda et al. ................ 257/77 |
| 5,846,375 A | 12/1998 | Gilchrist et al. ............. 156/345 |
| 5,863,376 A | 1/1999 | Wicker et al. ............... 156/345 |
| 5,871,586 A * | 2/1999 | Crawley et al. ............. 118/715 |
| 5,953,827 A | 9/1999 | Or et al. ......................... 34/58 |
| 5,968,276 A * | 10/1999 | Lei et al. ................. 118/723 R |
| 6,051,286 A * | 4/2000 | Zhao et al. .................. 427/576 |
| 6,117,245 A | 9/2000 | Mandrekar et al. ......... 118/724 |
| 6,167,837 B1 * | 1/2001 | Cook ..................... 118/723 E |
| 6,170,430 B1 * | 1/2001 | Liu et al. ................. 118/723 E |

\* cited by examiner

TEMPERATURE CONTROLLED WINDOW WITH A FLUID SUPPLY SYSTEM

BACKGROUND OF THE INVENTION

1. Field of the Invention

The present invention relates to an apparatus and method for controlling the temperature of a surface in a processing chamber. More specifically, the invention relates to methods and apparatus for controlling the temperature of an energy transparent window or electrode of a processing chamber.

2. Background of the Related Art

Many processes for fabricating integrated circuits and other electronic devices, such as etching, chemical vapor deposition, and physical vapor deposition, are plasma-enhanced or plasma-assisted. These processes employ process gases which are excited to a plasma state within a vacuum chamber. As one example, plasma etching (typically referred to as "dry" etching) has become a well accepted process in semiconductor manufacturing. The etching process removes patterned material from the substrate surface located in a substrate processing system. Gases are the primary dry etch medium, and plasma energy is used to drive the reaction. The plasma is created by applying an electrical field to a gas or combination of gases. Inside the chamber, the substrate to be processed is placed on a negatively charged cathode. Positively charged ions from the plasma are attracted and accelerated toward the cathode's negative charge, and the ions impact the substrate surface. The ability to attract ions in a direction normal to the substrate surface allows manufacturers of integrated circuits and other electronic devices to achieve high quality, vertical etching profiles.

The plasma etch process occurs in two ways, either separately or in combination, depending on the material to be etched and the etch chemistry used: (1) chemically reactive ions and free radicals formed in the plasma strike the substrate surface where they react with the surface material and form volatile compounds which can be exhausted from the system; and (2) the ions may be attracted to the substrate surface and strike the substrate surface with sufficient impact energy to break the chemical bonds in the film, physically dislodging or "sputtering" material from the substrate surface.

In a plasma processing chamber, radio frequency (RF) electromagnetic energy is used to generate and maintain a plasma within the processing chamber. It is often necessary to control temperatures of surfaces within the process chamber. This is particularly true in the case of a reactor chamber having a chamber lid which acts as either an electrode or a window (window/electrode) for admitting RF power from an inductive antenna therethrough. For example, the chamber lid temperature tends to rise during plasma generation, due to heat absorption from the plasma and RF energy being coupled into the plasma. The plasma may cause the chamber components, such as the electrode or window, to approach temperatures of 660° C. and higher. The etch rate and etch selectivity can change as the temperature in the chamber changes. For example, the etch rate of oxides can decrease due to an increase in chamber temperature until eventually the etching may stop.

In addition, in some cases where the window/electrode is a semiconducting material, it may be necessary to control the temperature of the window/electrode within a particular temperature range to obtain the proper electrical properties of the window/electrode. The application of RF power to generate and maintain the plasma leads to heating of the surfaces within the chamber, including windows or electrodes or for combination window/electrodes.

Prior efforts to effectuate temperature control of chamber components, such as windows and electrodes made of dielectric, non-metallic or semiconductive materials, have centered around indirect cooling which relies on thermal conduction of heat from the chamber components to a heat sink such as a cooled metallic body or cooling channels formed in the antennae or coils themselves. Attempts to provide temperature, control in a processing chamber are shown in U.S. Pat. Nos. 5,863,376 and 5,074,456. However, these attempts to achieve temperature control have failed to directly control the temperature of a dielectric, non-metallic or semiconductive window or electrode. As a result, only indirect cooling has been achieved. Moreover, such prior attempts have caused complications and interference when overhead coils or antennas have been called for in a plasma chamber. Obviously, cooling apparatus compete for the same space or area as the coils or antenna or the cooling apparatus must be combined with the coils or antenna, limiting the optimization of either design.

Therefore, there remains a need for a method and apparatus which directly controls the temperature of a dielectric, non-metallic or semiconductive window or electrode. A further need remains to accomplish the foregoing with coil based chamber designs.

SUMMARY OF THE INVENTION

The present invention provides a method and apparatus for controlling the temperature of chamber components including ceramic, dielectric ceramic, and other non-metallic chamber components. One example of a temperature controlled chamber component of the invention includes a chamber lid acting as an energy transparent window or electrode (window/electrode) that allows efficient coupling of RF electromagnetic energy or microwave energy into the chamber. A fluid supply system delivers a fluid to a feedthrough and into a temperature control channel formed in the window or electrode. In one embodiment, a feedthrough mounts the chamber lid to a retaining ring and provides a conduit through which a fluid can be inlet and outlet from the temperature control channel.

In one aspect, a window comprising an upper plate and a lower plate is provided. The plates define a temperature control channel therebetween and include one or more inlets/outlets through which fluids flow in and out of the temperature control channel. The temperature control channel may be formed in one or partially in both plates so that when the plates are bonded together they form the temperature control channel. The window is preferably made of a dielectric, non-metallic or semiconductive material, such as a ceramic, silicon, poly-silicon and the like.

In another aspect, the invention provides a substrate processing system having a processing chamber, a chamber cover assembly including a retaining ring and a window having a temperature control channel disposed at least partially internal to the window and a fluid inlet and a fluid outlet fluidly connected to the temperature control channel.

Another aspect of the invention provides an apparatus for mounting a window on a chamber and providing a fluid to the window. A retaining ring is provided to mount the window and support the window on the chamber. The retaining ring preferably includes one or more feedthrough holes in which a feedthrough can be disposed to secure the window to the retaining ring and deliver fluids into the window. The feedthrough is disposed through the retaining ring and secured thereto on one end through a threaded connection. The other end of the feedthrough is received in a feedthrough pocket formed in the window. The feedthrough is retained in the feedthrough pocket using an o-ring.

The invention also provides methods to control the temperature of a chamber lid by delivering a fluid through a fluid inlet to a temperature control channel in the chamber lid which is at least partially internal to the chamber lid, and flowing the fluid through the temperature control channel. The temperature of the fluid is preferably controlled and monitored to enable accurate temperature control of the chamber lid.

BRIEF DESCRIPTION OF THE DRAWINGS

So that the manner in which the above recited features, advantages and objects of the present invention are attained and can be understood in detail, a more particular description of the invention, briefly summarized above, may be had by reference to the embodiments thereof which are illustrated in the appended drawings.

It is to be noted, however, that the appended drawings illustrate only typical embodiments of this invention and are therefore not to be considered limiting of its scope, for the invention may admit to other equally effective embodiments.

DETAILED DESCRIPTION OF A PREFERRED EMBODIMENT

The present invention provides a temperature controlled chamber component, such as a ceramic, dielectric or semiconductive energy transparent window and/or electrode, particularly a chamber lid electrode for use in a substrate processing system. The invention also provides methods for controlling the temperature of chamber components, including the energy transparent window and/or electrode, and a substrate positioned in the chamber for processing. In one aspect, the invention provides a dielectric, ceramic or semiconductive window having an upper plate and a lower plate, which when bonded or otherwise secured together form an internal temperature control channel through which a cooling (or heating) fluid can be flowed to provide temperature control of the window. The invention will be described below initially with reference to embodiments having an energy transparent window. However, it should be understood that the description applies to chamber configurations which comprise an electrode. An external control system preferably regulates the temperature of the fluid and adjusts the window or electrode temperature according to system and process requirements. In one aspect, a retaining ring mounts the window or electrode and provides fluid flow through a feedthrough and into the temperature control channel.

The invention will first be described in detail below with reference to an inductively coupled plasma chamber having a generally flat chamber cover assembly. A capacitively coupled chamber configuration as well as other inductively coupled chamber configurations will then be described. It is to be understood that the invention can be utilized in other chamber configurations requiring temperature control of a dielectric, non-metallic or semiconductive chamber component.

Figure 1:
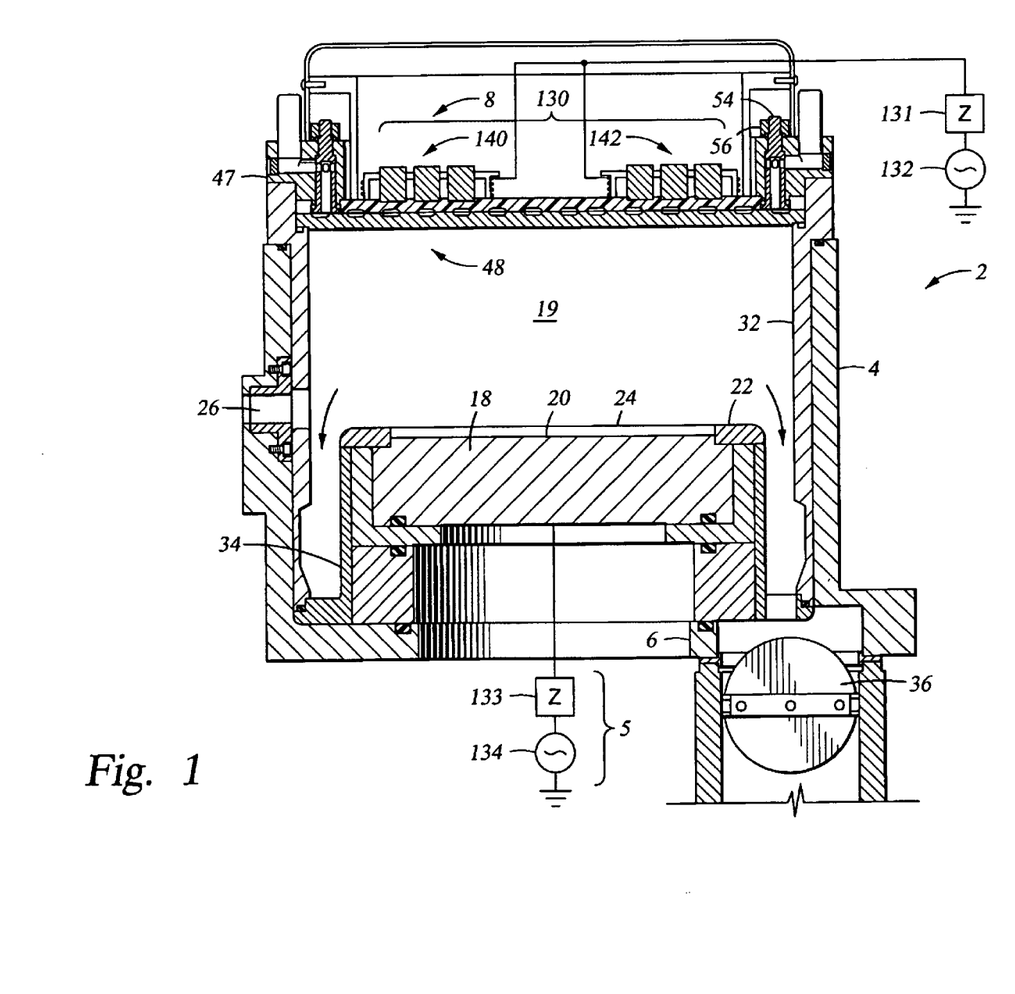
FIG. 1 is a cross section of an etch chamber of the invention.
Figure 9:
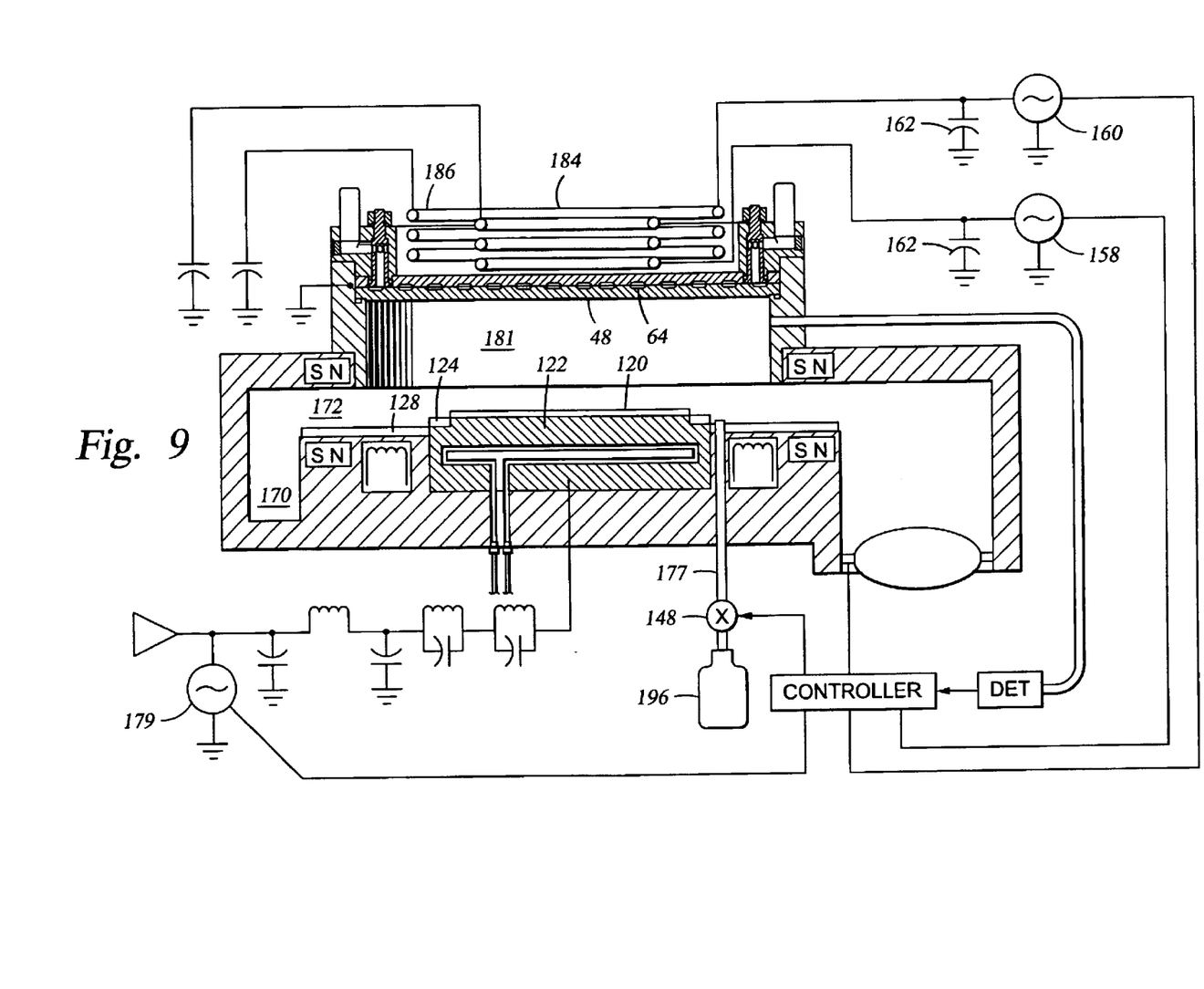
FIG. 9 is a cross sectional view of another embodiment of the invention illustrating an inductively coupled type chamber.
Figure 10:
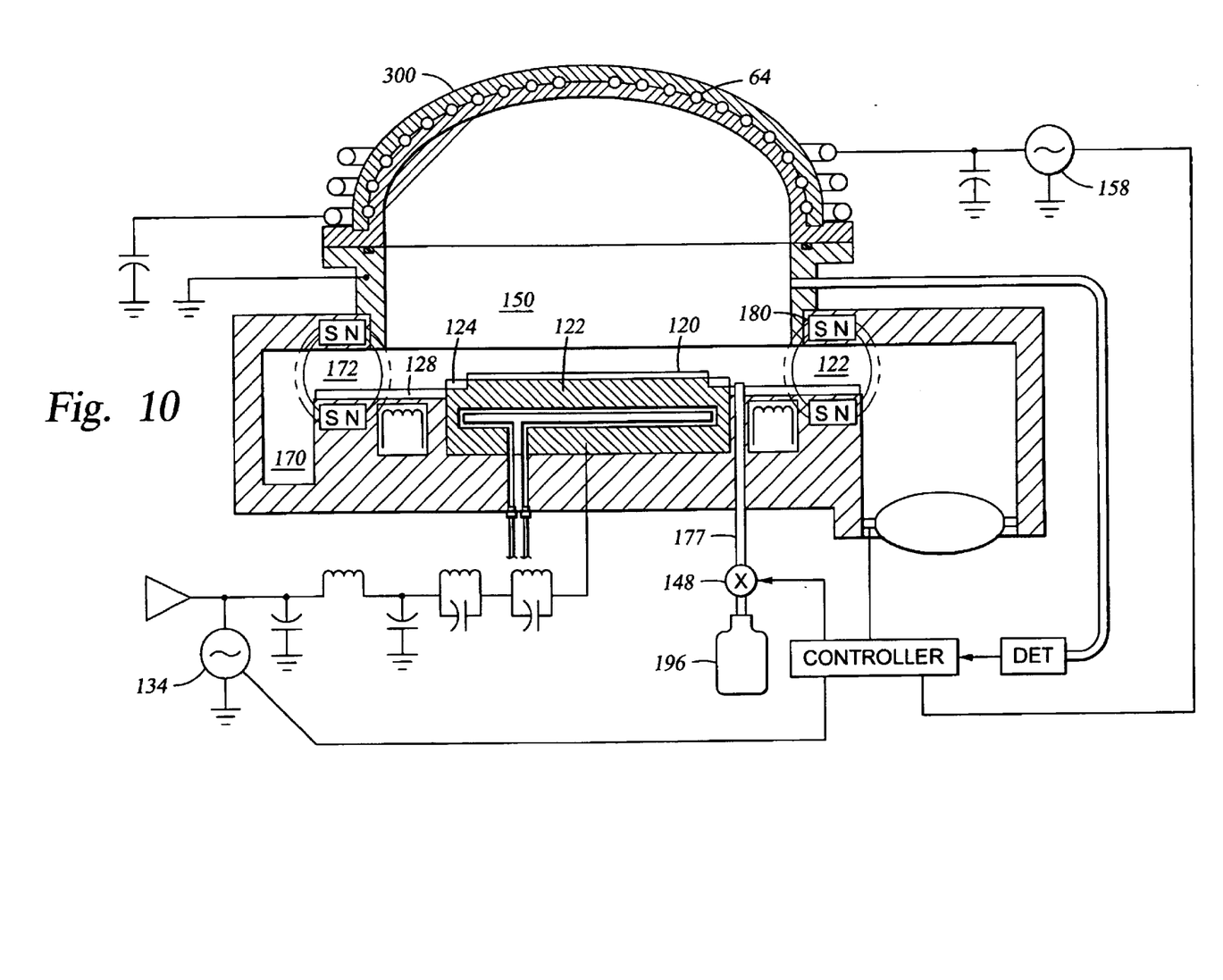
FIG. 10 is a cross sectional view of another embodiment of the invention illustrating an inductively coupled type chamber.

FIG. 1 is a cross sectional view of one embodiment of an etch chamber 2 of the present invention having a generally flat chamber cover assembly 8, including a chamber lid 48 acting as an energy transparent window. The chamber 2 generally includes an annular sidewall 4, a bottom wall 6, and a lid assembly 8. A pedestal 18 operating as a cathode is disposed in the lower portion of the chamber 2 and supports a substrate 24 during processing. The pedestal 18 is connected to a cathode power supply 5 which typically biases the pedestal to a negative voltage. A protective edge ring 22 is disposed on the upper surface 20 of the pedestal 18 and defines a perimeter in which a substrate 24 is positioned during processing. A cathode liner 34 may be disposed in the chamber 2 to surround the pedestal 18 and form a sacrificial deposition area which can be easily removed and cleaned. Similarly, an anode liner 32 may be disposed about the interior of the sidewall 4 to provide a removable surface on which deposition can occur during processing and be easily removed for cleaning. An array 130 of induction coils is disposed above the chamber lid 48 and will be described in detail below. Process gases are introduced into the etch chamber 2 via a variety of means (not shown), such as by a lower gas feed 177 as shown in FIGS. 9 and 10. Excessive process gases and volatile compounds produced during processing are exhausted through a gas outlet 36 by a vacuum pump (not shown). The chamber 2 also includes a slit opening 26 through which substrates 24 enter and exit the processing chamber 2.

A first RF power supply 132 supplies electrical power through a first impedance matching network 131 to an array 130 of induction coils mounted on the dielectric chamber lid 48. Each coil 140, 142 in the array 130 is wound around an axis which is parallel to the chamber axis, i.e., perpendicular to the chamber cover assembly 8 and to the substrate 24. The RF current through the induction coil array 130 produces an RF electromagnetic field in the region of the chamber 2 just below the chamber lid 48 so as to couple RF power to plasma in the chamber 2 and thereby enhance the density of the plasma.

Conventionally, a second impedance matching network 133 capacitively couples a second RF power supply 134 to the cathode electrode in pedestal 18 so as to produce a negative DC bias voltage on the cathode electrode relative to the electrically grounded chamber sidewalls 4. The negative bias voltage on the cathode electrode in pedestal 18 attracts ions from the process gas mixture toward the substrate 24 so that the process gases perform a desired process on the surface of the substrate 24, such as a conventional process for etching an existing film on the substrate 24 or for depositing a new film on the substrate 24.

Figure 2:
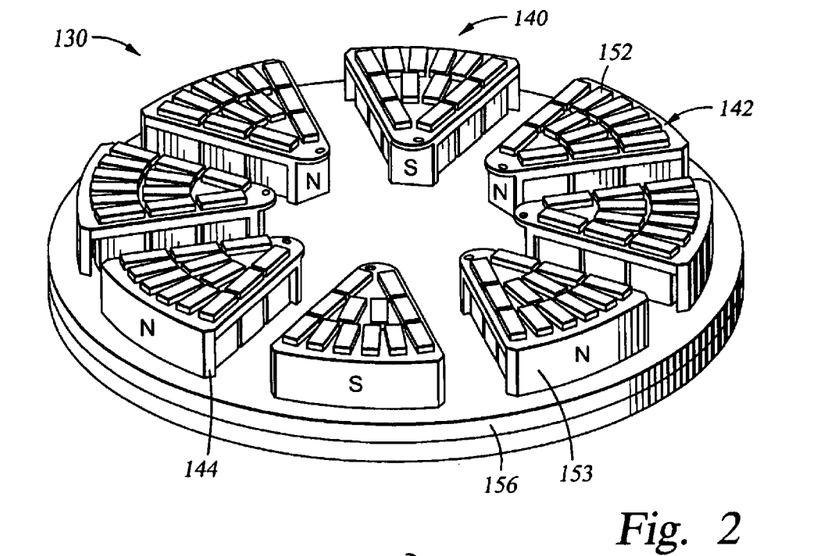
FIG. 2 is a substantially top perspective view of a coil array of an embodiment of the invention disposed on a chamber lid.
Figure 3:
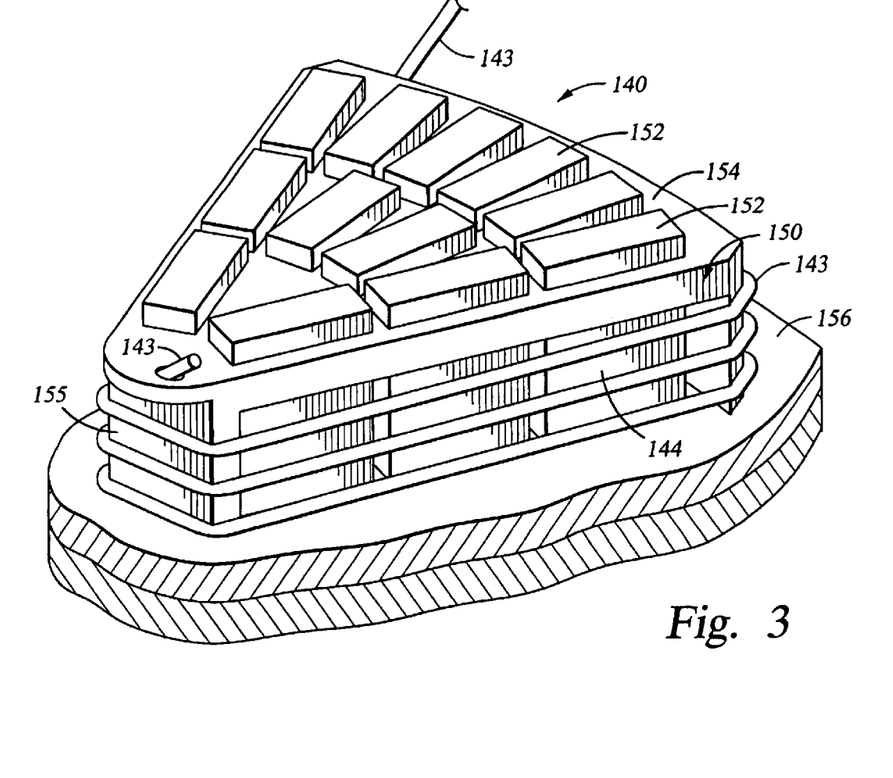
FIG. 3 is a substantially top perspective view of one coil in the array shown in FIG. 2.

FIGS. 2–3 depict the wedge shape of each of the eight induction coils 140, 142 in the array 130, the coils 140, 142 being equally spaced around the azimuth of the chamber lid 48. As shown in FIGS. 2 and 3, each coil 140, 142 has a number of turns of copper wire coil windings 143 wound around a hollow coil form 150. Each coil form 150 has a wedge-shaped top surface 154 and a U-shaped cross section when viewed from the side 144. Specifically, each coil form 150 consists of a curved, rectangular, wide outer surface 153; an almost triangular, wedge-shaped top surface 154; and a curved, narrow, inner tip surface 155. The azimuthal sides 144 of each coil form 150 are open.

Each coil form 150 is composed of a dielectric material so that the coil windings 143 can touch the form 150 without being electrically shorted out. The eight wedge-shaped coil forms 150 are attached to a single, disc-shaped base 156, preferably made of a high strength plastic. Preferably, each induction coil 140, 142 encircles a plurality of magnetic cores 152, preferably made of ferrite.

Figure 1A:
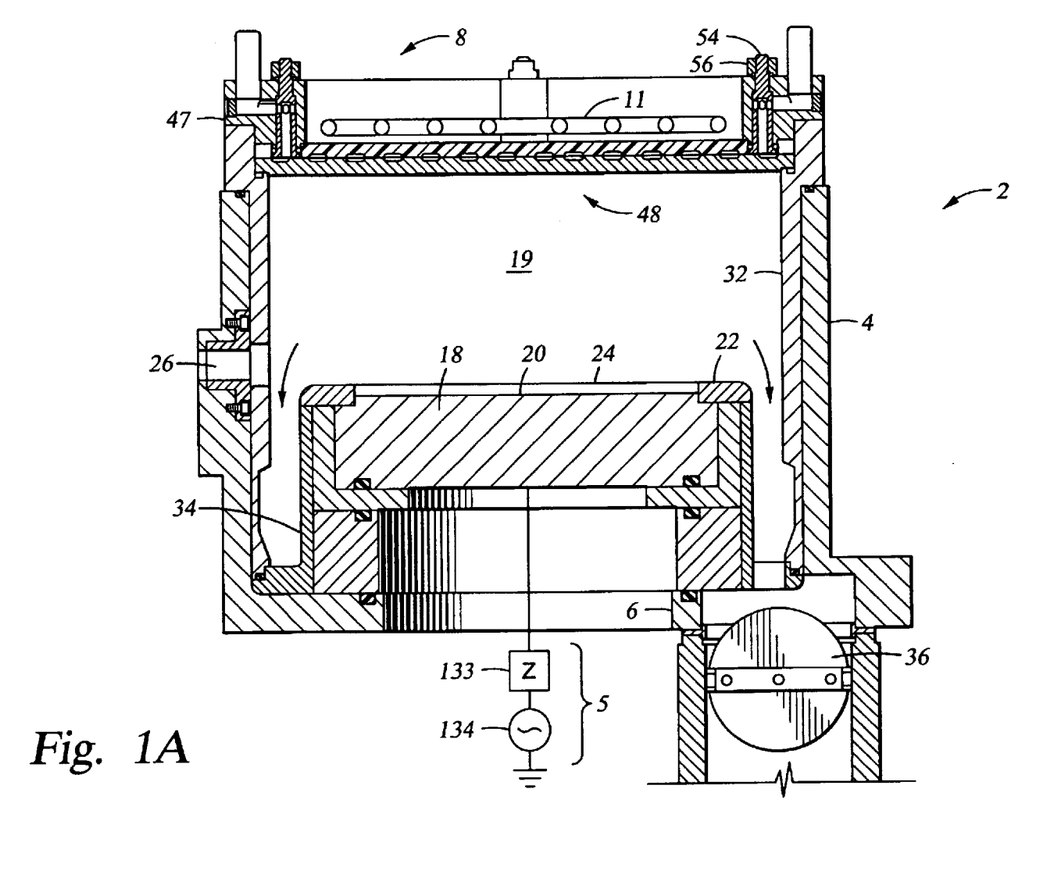
FIG. 1A is a cross section of an etch, chamber of the invention having a flat coil.

Further description of the array 130 and associated plasma chamber 2 described above can be had with reference to U.S. patent application Ser. No. 09/039,216, entitled "A Distributed Inductive Coupled Plasma Source with Ferrite Core Enhancement" filed on Mar. 14, 1998, which application is incorporated herein by reference. Alternatively, a chamber having a flat, spiral wound coil 11 disposed adjacent the window could also be used. FIG. 1a is a cross sectional view of a chamber illustrating one embodiment of a flat, spiral wound coil 11.

The temperature control aspects of the invention will be described in reference to the lid assembly 8 which in the first embodiment, shown in cross section in FIG. 1, includes a retaining ring 47, an energy transparent window 48 and one or more feedthroughs 54 which connect the window to the retaining ring and provide fluid flow into and out of the window.

Figure 4:
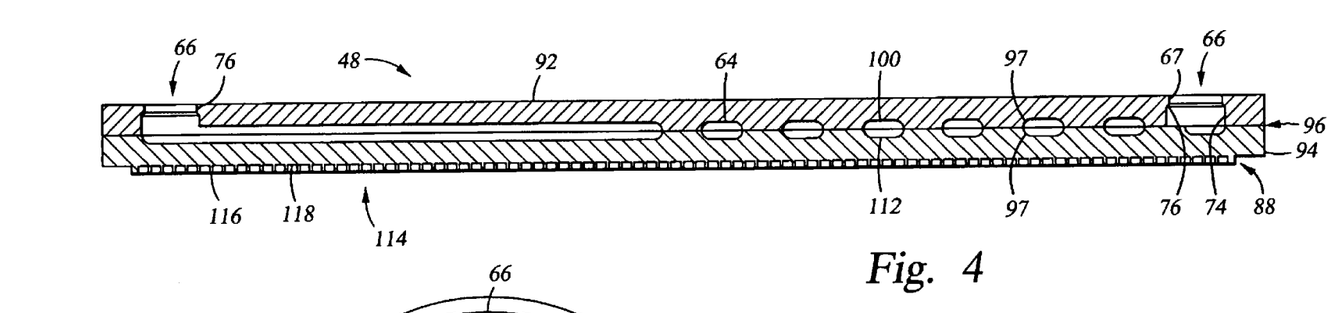
FIG. 4 is a cross sectional view of an energy transparent window of the invention.

FIG. 4 is a cross sectional view of a generally flat window 48 having a top plate 92 and a bottom plate 94 which when sealed together form an internal fluid channel 64. The fluid channel 64 is preferably continuous having one or more inlets/outlets 66 formed in the top plate 92. The fluid channel 64 is formed by milling or otherwise forming grooves 100, 112 in one or both of the plates 92, 94. In the embodiment shown in FIG. 2, the channel 64 is partially formed in each of the top and bottom plates so that when the plates are bonded or otherwise sealingly connected together they collectively form the channel 64. In an alternative embodiment, one plate may have the majority or even the entirety of the channel disposed therein and the other plate may act as a sealing backing plate. The grooves 100, 112 forming the channels are preferably rounded at corners 97 and may be a depth of about one-third the thickness of the plate. If the channel is formed entirely in the top plate, and the bottom plate is a planar backing surface, then the thickness of the top plate might be increased and the thickness of the bottom plate decreased so that the relative cross sectional thickness of the plates, subtracting the depth of the channel, is substantially the same. The grooves 100, 112 forming the channel 64 are sized and spaced to cover between about 30–60% of the surface area of the window 48. However, the size and spacing of the grooves forming the channel are determined by the application and the desired temperature control parameters useful for a particular processing application.

The lower surface 114 of the bottom plate 94 may include a textured portion having a series of peaks 116 and valleys 118 to increase the surface area of the bottom plate 94 disposed in the chamber 2, thereby providing additional area on which etched material can deposit. It is believed that increasing the surface of the chamber lid 48 adjacent the reaction zone 19 reduces the likelihood that material will build-up and potentially flake off and thereby reduces the likelihood of contamination of substrates 24 being processed.

The top plate 92 and bottom plate 94 are joined along a bond line 96. The bond line 96 preferably seals the periphery of the chamber lid 48 and the area between the grooves 100, 112 to define a sealed temperature control channel 64 throughout the chamber lid 48 with substantially no leakage between the plates 92, 94. The method of bonding the plates 92, 94 will vary depending on the materials selected to form the plates 92, 94. Liquid and/or gaseous fluids are flowed through the temperature control channel 64 to provide temperature control to the chamber lid 48. The fluid is preferably a liquid such as de-ionized water and/or ethylene glycol. Other fluids, such as liquid or gaseous nitrogen or freon, can also be used. Where required in the case of conductive or semiconductive windows, the fluid can be a dielectric fluid. Alternatively, the chamber lid 48 could be uniformly heated using heated fluids.

Figure 5:
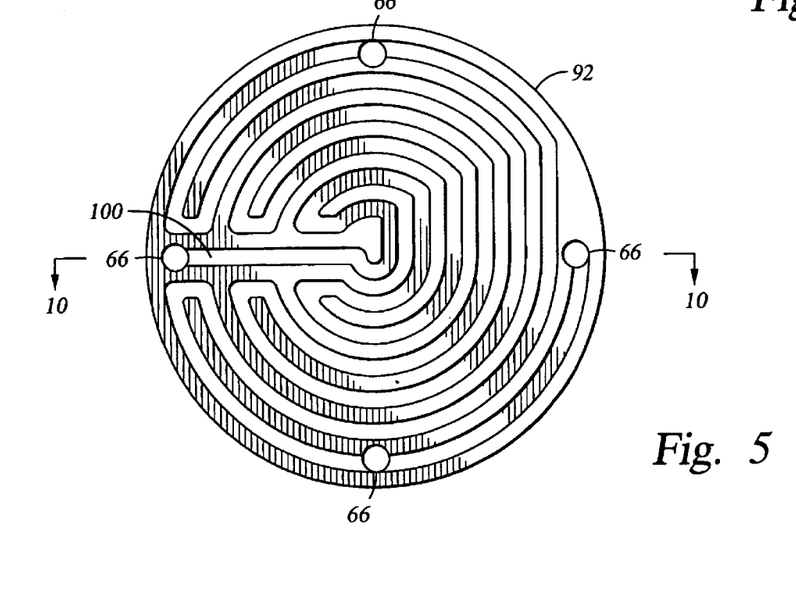
FIG. 5 is a bottom view of a top plate illustrating one temperature control channel pattern.
Figure 6:
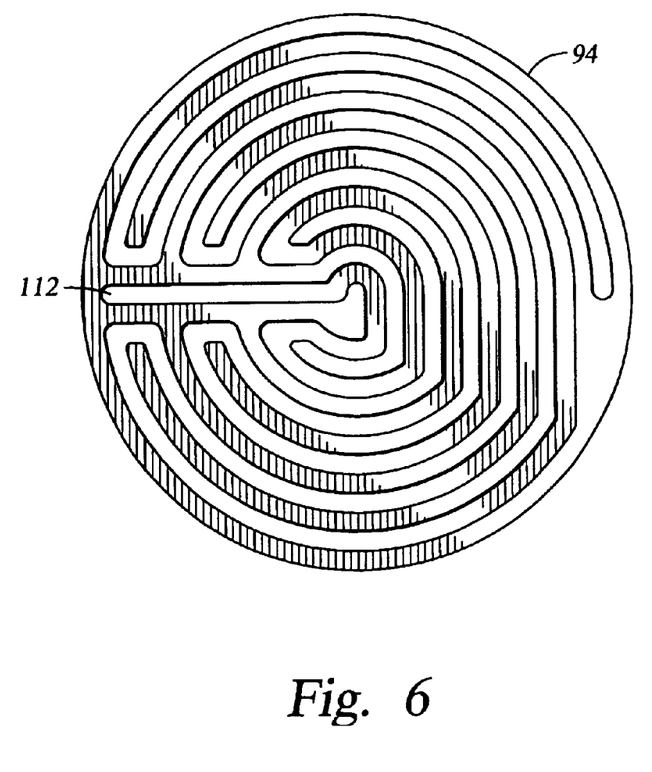
FIG. 6 is a top view of a bottom plate illustrating one temperature control channel pattern.
Figure 8:
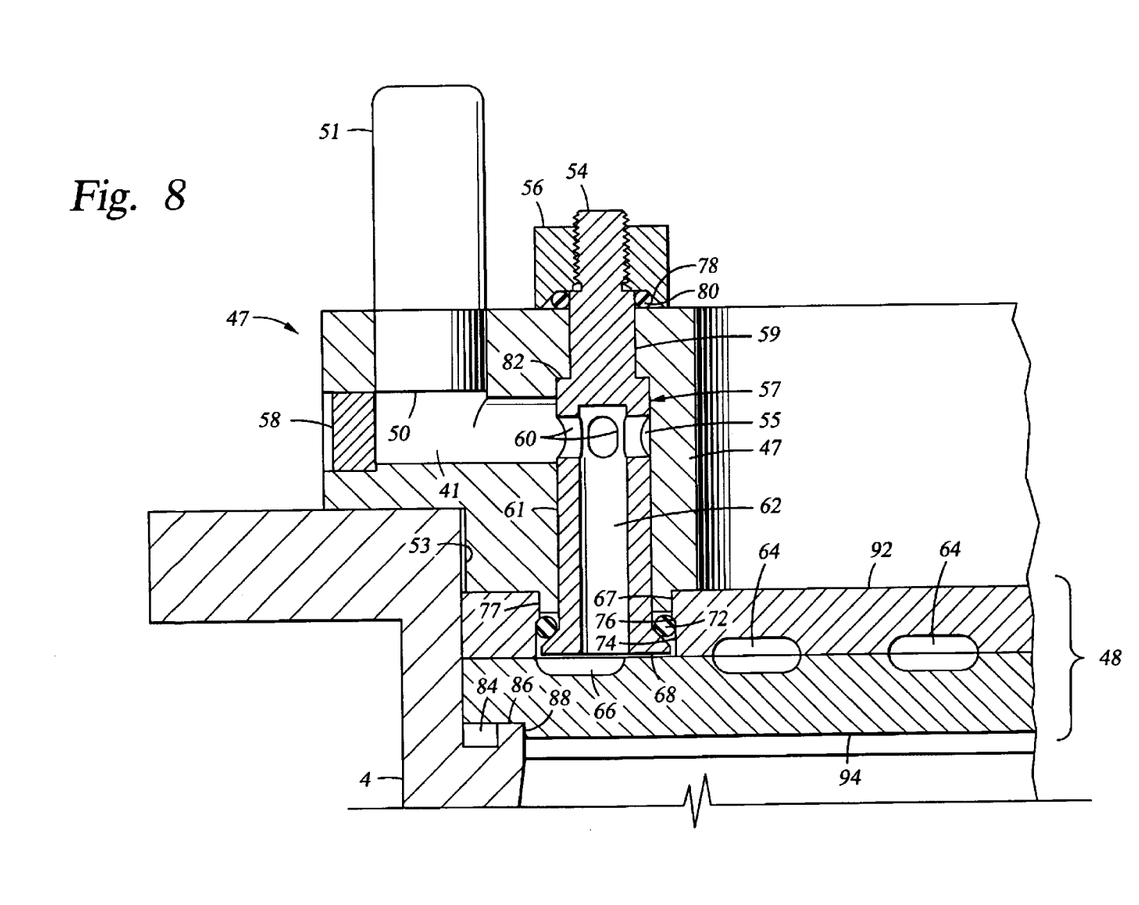
FIG. 8 is a partial cross sectional view of a chamber cover assembly showing the retaining ring, energy transparent window and a feedthrough.

FIGS. 5 and 6 are a bottom and top view of top and bottom plates 92, 94, respectively. The groove 100 is formed in the lower surface of the top plate 92 and extends from an inlet/outlet, referred to herein as a feedthrough pocket 66, located at the perimeter of the chamber lid 48 inwardly toward the center of the chamber lid 48. The feedthrough pocket 66 has a first and a second diameter 67, 74 which define a pocket shoulder 76 therebetween on which an o-ring 72 can be compressed to form a seal between the retaining ring 47, the feedthrough pocket 66 and the feedthrough 54, the latter two described in more detail below. The feedthrough pockets 66 are preferably symmetrically arranged about the chamber lid 48 for ease in alignment with the retaining ring 47 and the chamber lid 48 and to provide uniform flow of fluids into and out of the chamber lid 48. The groove 100 then forms a semicircular pattern as the groove 100 extends outwardly to another inlet/outlet corresponding to a second feedthrough pocket 66 disposed on the outer perimeter of the chamber lid 48. Similarly, a groove 112 is formed in the upper surface of the bottom plate 94 and is adapted to mate with the groove 100 of the top plate 92 when the plates 92, 94 are sealed together. The outer perimeter of the bottom plate 94 includes a shoulder 88 (as shown in FIG. 8) which assists in aligning the chamber lid 48 in the inner diameter of the chamber 2 and supporting the chamber lid 48 on the chamber sidewall 4.

The chamber lid 48 is preferably made of materials that are transparent or translucent to electromagnetic radiation, such as RF energy, including alumina (aluminum oxide), aluminum nitride, silicon carbide, silicon, polysilicon, and other dielectric, non-metallic and semiconductive materials and combinations thereof. The plates 92, 94 may be made of the same or different materials. In addition, materials having a high thermal conductivity can be used to advantage to conduct heat into the fluid in the temperature control channel 64. The chamber lid material may include a glazing material that exhibits an increased strength by aligning the material along its natural axis at a bond line.

Figure 7:
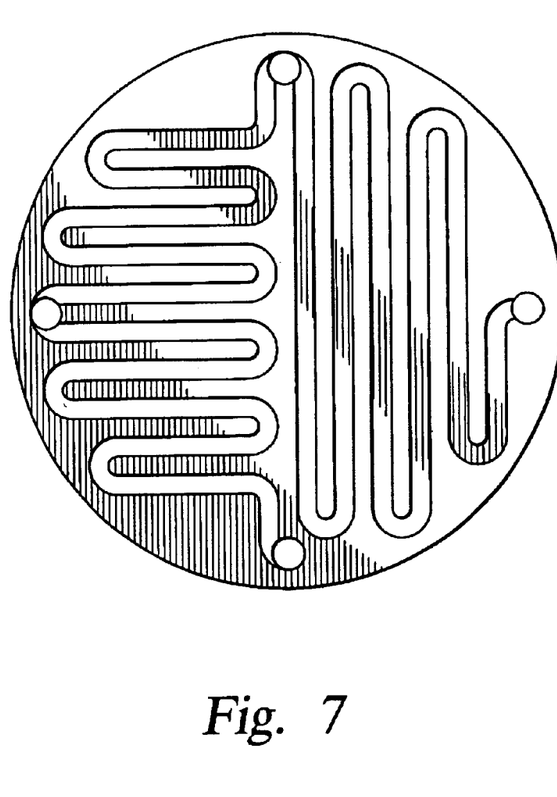
FIG. 7 is a bottom view of a top plate illustrating another temperature control channel pattern.

FIG. 7 is a bottom view of a top plate 92 illustrating another pattern for the temperature control channel 64. A variety of other patterns could be formed in the bottom plate 94 as well as the top plate 92 to form a temperature control channel 64 having a desired thermal profile across its surface. In addition, multiple temperature control channels 64 could be formed in the chamber lid 48 having separate inlets and outlets to enable independent temperature control of multiple zones or areas on the chamber lid 48. For example, the central portion of the chamber lid 48 may require more heat dissipation as opposed to the peripheral portion of the chamber lid 48. In other embodiments, a different pattern (arcuate, meandering, random or combinations thereof) could be made in the bottom plate 94 and the top plate 92 to achieve different flow patterns and different temperature controlled areas of the chamber lid 48. Still further, the temperature control channels 64 might be asymmetrical, such as with different depths or thickness in different portions of the plate(s) 92, 94, to achieve different thermal conduction conditions in select areas. Still further, the feedthrough 54 and corresponding retaining ring feedthrough hole 57 can be used for the inlet and another feedthrough 54 and corresponding retaining ring feedthrough hole 57 for the outlet. In addition, a variety of inlets and outlets may be used to supply fluid to the temperature controlled chamber lid 48. For example, an outlet may be disposed in the chamber lid 48 that bypasses the retaining ring 47.

Alternatively, chamber lid 48 could be of a one-piece construction in which fluid passageways or pathways are drilled or otherwise formed laterally there through, and which may be intersecting, parallel or otherwise non-intersecting. However, it would be substantially more difficult, as compared to the above-described two-piece construction, to form such passageways laterally in a one-piece chamber lid 48; to form meandering or other non-straight or curved passageways therethrough; and to handle the greater multiplicities of fluid input and output connectors for the resulting greater number of fluid inputs and outputs that would be required by straighter passageway geometries.

FIG. 8 is a partial cross sectional view illustrating the connection between the retaining ring 47 and the chamber lid 48 through a feedthrough 54. The retaining ring 47 supports the chamber lid 48 in the chamber 2 and provides inlet/outlet connections to the temperature control channel 64 in the chamber lid 48. The retaining ring 47 includes one or more inlet/outlet openings 50 to which fluid connectors 51 are connected. A transverse passage 41 is formed in the retaining ring 47 between inlet/outlet openings 50 and feedthrough holes 57 through which a feedthrough 54 is sealably disposed. The inlet/outlet openings 50 are generally threaded to allow connection of the fluid connectors 51 which in turn may be connected to hoses, pipes or other conduits (not shown). The feedthrough holes 57 have an upper portion 59 and a lower portion 61 of varying diameter which define a shoulder 82. The transverse passage 41 intersects the feedthrough hole 57. The retaining ring 47 includes one or more alignment shoulders 77 which correspond to each feedthrough hole 57 and provide alignment between the retaining ring 47 and the chamber lid 48.

The feedthroughs 54 preferably include an elongated body portion having a first and second diameter corresponding to the first and second diameters of the feedthrough hole 57. The lower end of the feedthroughs 54 include an enlarged tapered engagement portion 68. The upper end of the feedthroughs 54 include a threaded portion on which a retaining nut 56 can be received. The feedthroughs 54 define an outer annular channel 55 in which one or more, preferably two, transverse feedthrough ports 60 are formed. The channels 55 and feedthrough ports 60 are in fluid communication with the transverse passage 41 formed in the retaining ring 47 and an axial channel 62 formed at least partially along the length of the feedthroughs 54.

The tapered engagement portion 68 of the feedthrough 54 is adapted to fit into the feedthrough pocket 66 of the chamber lid 48. The feedthroughs 54 are inserted into feedthrough holes 57 in the retaining ring 47 and secure the chamber lid 48 to the retaining ring 47 via the threaded end of the feedthrough 54 and a fastener 56. A sealing element 72 is disposed below the pocket shoulder 76 to seal the tapered engagement portion 68 of the feedthrough 54 in the feedthrough pocket 66 between the alignment shoulder 77 of the retaining ring 47, the pocket shoulder 76 and the tapered portion 68 of the feedthrough. The alignment shoulder 77 presses the sealing element 72 into position along the tapered engagement portion 68 of the feedthrough 54. Alternatively, the alignment shoulder 77 could simply be a washer that similarly presses the sealing element 72 into position along the tapered engagement portion 68. A chamber support 86, connected to the upper surfaces of the sidewall 4, is located below the chamber lid 48 and supports the chamber lid 48 in position while the fastener 56 is tightened to the feedthrough 54. Additionally, the sidewall 4 may include a sealing groove 84 into which another sealing element may be placed. This sealing element may be particularly useful as the chamber 2 is brought to a vacuum and pulls the lid down into engagement with the chamber 2. A lid support shoulder 88, formed in the chamber lid 48, may assist the chamber lid 8 alignment with the sidewall 4.

A sealing element 80 is located at the top end of the feedthrough 54 to seal the feedthrough 54 and the retaining ring 47. The sealing element(s) 80 may be an O-ring, gasket, sealing compound such as silicone, or other typical sealing elements. To compress the sealing element 80 between the feedthrough 54 and retaining ring 47, the fastener 56 includes a tapered fastener portion 78. The tapered portion 78 allows progressive compression of the sealing element 80 against the feedthrough 54 and retaining ring 47 as the fastener 56 is tightened to the feedthrough 54. The fastener taper angle may vary between about 0 and about 90 degrees, and in one embodiment, the angle is about 35 degrees from the longitudinal axis of the feedthrough 54. The resilient sealing element(s) 80 allows for misalignment and for thermal expansion and contraction between the feedthrough 54 and the chamber lid 48 and between the feedthrough 54 and the retaining ring 47.

Two other embodiments of a chamber and chamber lid are illustrated in FIGS. 9 and 10. The embodiments shown illustrate two respective configurations for an inductively coupled plasma chamber. In FIG. 9, a substrate 120 is supported on a pedestal 122 operating as a cathode electrode and including an electrostatic chuck and a protective edge ring 124.

The RF biased pedestal 122 acts as a cathode in opposition to the grounded silicon chamber lid 48. The first RF power supply 179 supplies bias power to the pedestal 122. A lower gas feed 177 penetrates the silicon ring 128 and supplies gas mixture from several gas sources 196 through a bank of mass flow controllers 148 to a processing region 181 over the pedestal 122.

A chamber lid 48 made of silicon, polysilicon or other semiconductive material, is disposed in opposition to the pedestal 122. Its thickness and semiconductor doping level are chosen so that it both can act as an electrode, here as an electrically grounded anode, as well as can pass generally axial RF magnetic fields generated by inner and outer inductive coils 184, 186 positioned behind the chamber lid 48. A cooling channel 64 is formed in the chamber lid 48 to provide temperature control of the chamber lid 48 similar to the embodiments described above. The cooling channel 64 can replace the thermal control plate which is typically coupled to the back of chamber lid 48 and below the coils 184, 186. The inner and outer coils 184, 186 are powered respectively by second and third RF power supplies 158, 160. The RF power supplies 158, 160 are connected to respective first ends of the coils 184, 186 and tuning and loading capacitors 162 are connected between the first and second ends of the coils 184, 186 and ground. The RF power supplied to the coils 184, 186 in such proportions as to provide a more uniform plasma is inductively coupled into the source region of the processing region 181 between the pedestal 122 and the chamber lid 48. The amount of power supplied to coils 184, 186 is primarily responsible for the density or strength of the plasma. The power supplied to the pedestal 122 is capacitively coupled into the plasma adjacent to the principal surface of the substrate 120 and is responsible for the amount of DC bias of the plasma relative to the substrate 120.

An annular pumping channel 170 surrounds the processing region 181 and is connected to the processing region 181 through an annular flow constriction 172.

FIG. 10 illustrates another ICP type chamber having a domed chamber lid 300 with cooling channel 64 formed therein. The chamber components are similar to those of FIG. 9 and are numbered accordingly. As can be seen from the Figure, this embodiment includes a domed chamber lid 300 having an inductive coil disposed around the perimeter of the domed chamber lid 300. The cooling channels 64 of the invention are provided in the domed chamber lid 300 to enable direct temperature control of the domed chamber lid 300.

Figure 11:
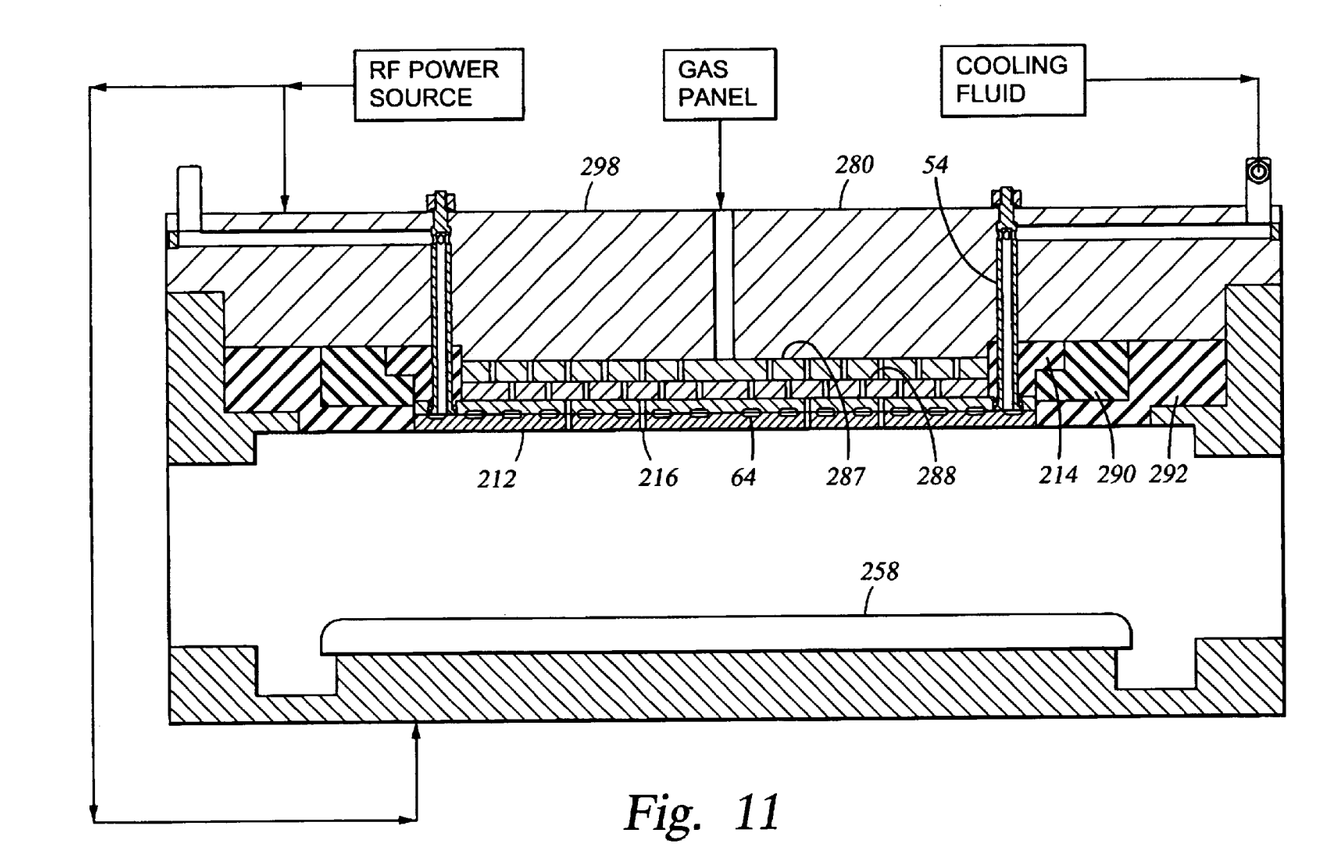
FIG. 11 is a cross sectional view of another embodiment of the invention illustrating a capacitively coupled type chamber.

In another embodiment illustrated in FIG. 11, the invention provides a parallel plate type reactor which typically includes an upper electrode assembly 298 and a lower electrode 258. The lower electrode 258 is a substrate support member. In such an embodiment, the construction provides for direct temperature control of the upper electrode assembly 298. The upper electrode generally comprises a backing plate 280 supporting a facing plate 212 having a substantially uniform thickness thereacross. The electrode plate 212 provides an electrode surface which is exposed to a plasma in the chamber and is therefore preferably made of a material which is compatible with the plasma chemistry used in the particular process. These materials may include graphite, polycrystalline silicon, quartz, glassy carbon, single crystal silicon, pyrolytic graphite, silicon carbide, alumina, zirconium, diamond coated materials or titanium oxide.

A support frame 214 in the shape of an annular ring is bonded or otherwise connected to the upper surface of the electrode plate 212. The support frame 214 provides mechanical support for the electrode plate 212 and also provides electrical and thermal connection of the electrode plate 212 to an RF source and heat sink. Thus, the support frame 214 is preferably made of a material having a high electrical and thermal conductivity, such as graphite, aluminum, copper, stainless steel and the like. In one aspect, the support frame 214 is an annular ring which is disposed at least partially on the outer perimeter of the electrode plate 212.

The electrode plate 212 is supported in the chamber on the support frame 214. A backing plate 280 is connected to the upper surface of the electrode plate 212. A pair of baffle plates 287, 288 are preferably disposed between the backing plate 280 and the electrode plate 212 to uniformly distribute gases introduced to the back of the baffle plates 287, 288. The gases enter the chamber through one or more apertures 216 formed in the electrode plate 212. The support frame 214 is supported on one or more insulating rings 290, 292 disposed on the chamber wall.

A cooling assembly of the invention is provided to deliver a cooling fluid to the electrode plate 212. Temperature control channels 64 are formed in the electrode plate 212 and are connected to a source of fluid by one or more feedthroughs 54 disposed through the support frame 214 and backing plate 280. The backing plate 280 and support frame 214 provide a hole in which the feedthrough 54 is disposed to connect to the electrode plate 212 to deliver fluid thereto. The connection to the electrode plate 212 can be formed as shown in the embodiment of FIGS. 1 and 4–8 described above. The electrode plate 212 is formed of two facing members which may be made of the same or different materials similarly to the embodiments described above. In addition, the temperature control channels 64 may be formed in both members or substantially in one member with a generally smooth surface of the other member forming a wall of the channels. In addition, the top member may be a metal or conductive material while the bottom member is a silicon containing material. In a preferred embodiment, both members are formed of a silicon containing material. Both members could be a metal or other conductive material.

Alternatively, the baffle plates could be omitted and the gases could enter the chamber via orifices mounted adjacent to or within the chamber sidewalls. The electrode plate 212 may be made thicker or stronger and thus obviating the need for a backing plate 280. In such a case, the electrode plate 212 would simply be of two-piece construction with the temperature control channels 64 defined therebetween as described above, for example, in connection with FIG. 1, but with no overhead coil array 130 and with at least the bottom member facing the plasma being a conductor or semiconductor. Both members comprising such a two-piece electrode plate 212 could also be made of metal, e.g., anodized aluminum or the surface facing the plasma could be coated with a material to help preclude deterioration under plasma conditions or to enhance compatibility with the plasma process. Also, alternatively the electrode plate 212 could be of a one-piece construction, along the lines suggested previously in the case of the window embodiment. Such a one-piece electrode plate 212, as well as any of the members of the electrode plate 212 construction described above, could be drilled or otherwise apertured to provide temperature control channels therethrough. In any alternative in which coolant flow would encounter a conductive or semi-conductive surface of the electrode plate 212, the coolant should preferably be a dielectric fluid.

The terms "below", "above", "bottom", "top", "up", "down", "upper", and "lower" and other positional terms are shown with respect to the embodiments in the figures and may be varied depending on the relative orientation of the processing system.

While the foregoing is directed to the preferred embodiment of the present invention, other and further embodiments of the invention may be devised without departing from the basic scope thereof, and the scope thereof is determined by the claims that follow. Furthermore, in this specification, including particularly the claims, the use of "comprising" with "a" or "the", and variations thereof means that the item(s) or list(s) referenced includes at least the enumerated item(s) or list(s) and furthermore may include a plurality of the enumerated item(s) or list(s), unless otherwise stated.

What is claimed is:

1. A processing chamber, comprising:

a chamber body;

a substrate support member disposed within the chamber body;

a retaining ring having one or more feedthrough holes formed therein;

one or more feedthroughs disposed in the one or more feedthrough holes; and a chamber lid connected to the retaining ring by the one or more feedthroughs, the chamber lid comprising a first plate coupled to a second plate, wherein the first plate and the second plate form a temperature control channel, wherein a fluid inlet and a fluid outlet are formed in the chamber lid, and wherein the fluid inlet and the fluid outlet are fluidly coupled to the one or more feedthroughs.

2. The processing chamber of claim 1, wherein the chamber lid further comprises one or more feedthrough pockets in which the one or more feedthroughs are received to connect the chamber lid to the retaining ring.

3. The processing chamber of claim 2, wherein at least one of the one or more feedthroughs comprises an enlarged engagement portion, the enlarged engagement portion being insertable into a portion of a feedthrough pocket.

4. The processing chamber of claim 2, wherein at least one of the one or more feedthrough pockets comprises a pocket shoulder for receiving a sealing element therein.

5. The processing chamber of claim 1, further comprising a fastener adapted to attach the feedthrough to the retaining ring.

6. The processing chamber of claim 1, wherein the retaining ring further comprises one or more fluid passages fluidly connected to the one or more feedthrough holes.

7. The processing chamber of claim 1, wherein each feedthrough comprises:

an axial channel along a portion of a length of the feedthrough; and one or more transverse ports fluidly connected to the axial channel.

8. The processing chamber of claim 1, wherein the retaining ring further comprises an alignment shoulder adapted to align the chamber lid to the retaining ring.

9. The processing chamber of claim 1, wherein the first plate and the second plate each form a portion of the depth of the temperature control channel.

10. The processing chamber of claim 1, wherein the temperature control channel is continuous between the fluid inlet and the fluid outlet.

11. The processing chamber of claim 1, further comprising one or more feedthrough pockets fluidly connected to the temperature control channel, wherein at least one feedthrough pocket is fluidly connected to a feedthrough, and wherein the feedthrough secures the chamber lid to the retaining ring.

12. The processing chamber of claim 1, wherein the temperature control channel forms a circuitous pattern substantially throughout the chamber lid.

13. The processing chamber of claim 1, wherein the surface area of the temperature control channel comprises between about 30% and about 60% of the surface area of the chamber lid.

14. The processing chamber of claim 1, wherein the temperature control channel is structured and arranged to cover between about 30% to about 60% of the surface area of the chamber lid.

15. The processing chamber of claim 1, wherein the chamber lid comprises a material selected from the group of aluminum oxide, aluminum nitride, silicon carbide, silicon, polysilicon and combinations thereof.

16. The processing chamber of claim 1, wherein the temperature control channel is formed by a groove in one of the plates and a generally smooth face of the other plate.

17. The processing chamber of claim 1, wherein the temperature control channel is formed by at least one groove in each of the first and second plates.

18. The processing chamber of claim 1, wherein the temperature control channel is arcuate, radial, meandering or a combination thereof.

19. The processing chamber of claim 1, wherein a surface of the second plate is textured.

20. A processing chamber comprising:

a chamber body;

a substrate support member disposed within the chamber body;

a retaining ring coupled to the chamber body, wherein the retaining ring has a feedthrough hole formed therein;

a chamber lid coupled to the retaining ring, wherein the chamber lid forms a fluid inlet, a fluid outlet, and a temperature control channel, and wherein the temperature control channel is fluidly connected to the fluid inlet and fluid outlet; and a feedthrough disposed in a feedthrough hole, wherein the feedthrough is fluidly connected to the temperature control channel, and wherein the feedthrough attaches the chamber lid to the retaining ring.

* * * * *

UNITED STATES PATENT AND TRADEMARK OFFICE
CERTIFICATE OF CORRECTION

| | | |
|---|---|---|
| PATENT NO. | : 6,916,399 B1 | Page 1 of 3 |
| APPLICATION NO. | : 09/325026 | |
| DATED | : July 12, 2005 | |
| INVENTOR(S) | : Yan Rozenzon et al. | |

It is certified that error appears in the above-identified patent and that said Letters Patent is hereby corrected as shown below:

On The Title Page Item (73)

Add Assignee: Applied Materials, Inc., P.O. Box 450-A, Santa Clara, CA 95052

Column 2, Line 11: Delete the comma after "temperature"

Column 3, Line 31: Delete the comma after "etch"

Column 5, Line 39: Change "window" to --chamber lid 48--

Column 5, Line 39: Change "1a" to --1A--

Column 5, Line 43: Change "lid" to --chamber cover--

Column 5, Line 45: Change "an energy transparent window" to --a chamber lid--

Column 5, Line 46: Change "window" to --chamber lid 48--

Column 5, Line 47: After "ring", insert --47--

Column 5, Line 47: After "provide", insert --a--

Column 5, Line 48: Change "window" to --chamber lid 48, as shown more clearly in FIG. 8.--

Column 5, Line 49: Change "window" to --chamber lid--

Column 5, Line 51: Change both instances of "fluid" to --temperature control--

Column 5, Line 53: Change "inlets/outlets" to --feedthrough pockets--

Column 5, Line 53: Change "fluid" to --temperature control--

Column 5, Line 56: Change "2" to --4--

Column 5, Line 56: Before "channel", insert --temperature control--

Column 5, Line 57: After both instances of "plates", insert --92, 94--

UNITED STATES PATENT AND TRADEMARK OFFICE
CERTIFICATE OF CORRECTION

PATENT NO.       : 6,916,399 B1
APPLICATION NO.  : 09/325026
DATED            : July 12, 2005
INVENTOR(S)      : Yan Rozenzon et al.

It is certified that error appears in the above-identified patent and that said Letters Patent is hereby corrected as shown below:

Column 5, Line 59: Before "channel", insert --temperature control--

Column 5, Line 61: Before "channel", insert --temperature control--

Column 5, Line 61: After "channel", insert --64--

Column 5, Lines 62-63: Change "the channels" to --temperature control channel 64--

Column 5, Line 65: Before "channel", insert --temperature control--

Column 5, Line 65: After "channel", insert --64--

Column 5, Line 65: After "plate", insert --92--

Column 5, Line 66: After "plate", insert --94--

Column 5, Line 67: After "plate", insert --92--

Column 6, Line 1: After "plate", insert --94--

Column 6, Line 2: After "plates", insert --92, 94--

Column 6, Line 2: Before "channel", insert --temperature control--

Column 6, Line 2: After "channel", insert --64--

Column 6, Line 4: Before "channel", insert --temperature control--

Column 6, Line 5: Change "window" to --chamber lid--

Column 6, Line 6: After "grooves", insert --100, 112--

UNITED STATES PATENT AND TRADEMARK OFFICE
CERTIFICATE OF CORRECTION

PATENT NO. : 6,916,399 B1
APPLICATION NO. : 09/325026
DATED : July 12, 2005
INVENTOR(S) : Yan Rozenzon et al.

It is certified that error appears in the above-identified patent and that said Letters Patent is hereby corrected as shown below:

Column 6, Line 6: Before "channel", insert --temperature control--

Column 6, Line 6: After "channel", insert --64--

Signed and Sealed this

Twenty-second Day of January, 2008

JON W. DUDAS
*Director of the United States Patent and Trademark Office*